(12) United States Patent
Okuno (10) Patent No.: US 12,348,232 B2
(45) Date of Patent: Jul. 1, 2025

(54) DELAY CONTROL CIRCUIT, SEMICONDUCTOR MEMORY DEVICE, AND DELAY CONTROL METHOD

(71) Applicant: Winbond Electronics Corp., Taichung (TW)

(72) Inventor: Shinya Okuno, Yokohama (JP)

(73) Assignee: WINDBOND ELECTRONICS CORP., Taichung (TW)

( * ) Notice: Subject to any disclaimer, the term of this patent is extended or adjusted under 35 U.S.C. 154(b) by 201 days.

(21) Appl. No.: 18/348,009

(22) Filed: Jul. 6, 2023

(65) Prior Publication Data

US 2024/0014823 A1 Jan. 11, 2024

(30) Foreign Application Priority Data

Jul. 6, 2022 (JP) .................. 2022-108866

(51) Int. Cl.
*G11C 11/40* (2006.01)
*G11C 11/4076* (2006.01)
*G11C 11/4093* (2006.01)
*H03L 7/081* (2006.01)
*H03L 7/085* (2006.01)

(52) U.S. Cl.
CPC ........ *H03L 7/0812* (2013.01); *G11C 11/4076* (2013.01); *G11C 11/4093* (2013.01); *H03L 7/085* (2013.01)

(58) Field of Classification Search
CPC ..... H03L 7/0812; H03L 7/085; H03L 7/0814; H03L 7/0816; G11C 11/4076; G11C 11/4093; G11C 7/222; G11C 11/4063; H03K 5/135
See application file for complete search history.

(56) References Cited

U.S. PATENT DOCUMENTS

| 8,484,501 B2 | 7/2013 | Drexler | |
|---|---|---|---|
| 2006/0066374 A1* | 3/2006 | Tomita | G06F 1/12 327/291 |
| 2015/0372683 A1* | 12/2015 | Takahashi | H03L 7/0816 327/158 |

FOREIGN PATENT DOCUMENTS

| CN | 107735836 A | 2/2018 |
|---|---|---|
| JP | 2006-98103 A | 4/2006 |
| JP | 2013-222997 A | 10/2013 |
| JP | 2015-35241 A | 2/2015 |

(Continued)

*Primary Examiner* — Xiaochun L Chen
(74) *Attorney, Agent, or Firm* — Birch, Stewart, Kolasch & Birch, LLP (57) ABSTRACT

A delay control circuit provided herein includes a DLL control circuit, a delay line circuit, and an N-value detection circuit. The DLL control circuit determines the delay amount based on the phase difference between the input and output clock signals. The delay line circuit delays the input clock signal based on the delay amount to generate an output clock signal. The N-value detection circuit performs an N-value detection operation for detecting the number of delayed clock cycles from the input clock signal to the output clock signal. When it is determined to be in an overflow state, the DLL control circuit outputs a signal indicating an overflow state to the N-value detection circuit. When the signal indicating the overflow state is received, the N-value detection circuit does not perform the N-value detection operation, but instead sets the number of delayed clock cycles to a predetermined value.

20 Claims, 6 Drawing Sheets

(56) References Cited

FOREIGN PATENT DOCUMENTS

TW           1705332 B     9/2020
WO    WO 2009/125580 A1   10/2009

* cited by examiner

DELAY CONTROL CIRCUIT, SEMICONDUCTOR MEMORY DEVICE, AND DELAY CONTROL METHOD

CROSS REFERENCE TO RELATED APPLICATIONS

This application claims priority of Japan Patent Application No. 2022-108866, filed on Jul. 6, 2022, the entirety of which is incorporated by reference herein.

BACKGROUND OF THE INVENTION

Field of the Invention

The present invention relates to a signal-delay technology, and more particularly it relates to a delay control circuit, a semiconductor memory device, and a delay control method suitable for a delay locked loop circuit.

Description of the Related Art

Dynamic Random Access Memory (DRAM) is a type of semiconductor memory device. This volatile memory stores information by accumulating charges in capacitors. Once the power is cut off, the stored information will be lost. In a conventional DRAM, such as Japanese Patent No. 2015-35241, a delay locked loop (DLL) circuit is provided as a phase synchronization circuit. DRAM uses DLL circuits to generate an internal clock signal, so that the output of the data signal is synchronized with the external clock signal.

In a conventional DRAM, in order to utilize a DLL circuit to adjust the delay of a clock signal, the required operations include a reset operation on the DLL circuit, a locking operation on the DLL circuit (for example, ensuring that the external clock signal operates synchronously with the internal clock signal when each delay line is activated), and an N-value detection operation. The latter operation indicates the number of delayed clock cycles between the input clock signal and the internal clock signal.

The lock (also called delay) time Tdll herein caused by the locking operation of the DLL circuit can be expressed using the following mathematical formula.

$$Tint + Tdll = N \times tCK$$

In this formula, Tint represents the existing delay time in the DLL circuit, and tCK represents the clock cycle. In order to avoid malfunctions, a clock delay adjustment procedure must be completed within the predetermined period tDLLK. However, when factors (such as temperature) in the semiconductor memory device cause the clock cycle tCK to be longer than the existing delay time Tint (especially when the activated delay lines exceed a predetermined number and cause an overflow state), the lock time Tdll of the DLL circuit will also be extended, as shown by the above mathematical formula. If the lock time is extended in this way, the overall time required for the clock delay adjustment procedure will become longer, and may exceed the predetermined period tDLLK.

BRIEF SUMMARY OF THE INVENTION

The object of the present invention is to provide a delay control circuit, a semiconductor memory device, and a delay control method capable of solving the above-mentioned problems. Therefore, even if the lock time is prolonged due to the overflow state of the delay line, the execution of the N-value detection sequence can be completed within the predetermined period.

The delay control circuit of the present invention includes a DLL control circuit, a delay line circuit, and an N-value detection circuit. The DLL control circuit determines the delay amount based on the phase difference between an output clock signal input clock signal and an output clock signal output clock signal. The delay line circuit delays the input clock signal based on the delay amount to generate an output clock signal. The N-value detection circuit performs an N-value detection operation when the input clock signal and the output clock signal are synchronized. The N-value detection operation is configured to detect the number of delayed clock cycles from the input clock signal to the output clock signal. The DLL control circuit is configured to determine whether it is in an overflow state by determining whether the delay amount exceeds a predetermined delay amount in the delay line circuit. When it is determined to be in the overflow state, a signal indicating the overflow state is output to the N-value detection circuit. When the N-value detection circuit receives a signal indicating the overflow state, the N-value detection circuit does not perform the N-value detection operation, but sets the number of delayed clock cycles to a predetermined value.

The semiconductor memory device of the present invention includes the above-mentioned delay control circuit; a memory cell array; an input buffer configured to provide the input clock signal; and an output buffer coupled to the output of the delay line circuit. According to the related invention, since the delay control circuit is included, the delay control circuit can shorten the execution time of the program, and prevent the execution time of the program from exceeding the predetermined period determined in advance by the program. Therefore, the reset operation is advanced and the response time is shortened.

The delay control method of the present invention includes determining the delay amount according to the phase difference between the input clock signal and the output clock signal. The method includes delaying the input clock signal based on the delay amount to generate the output clock signal. When the input clock signal and the output clock signal are synchronized, the number of delayed clock cycles from the input clock signal to the output clock signal is detected by the N-value detection circuit. The method includes determining whether it is in an overflow state by determining whether the delay amount exceeds predetermined delay in a delay line circuit. When it is determined to be in the overflow state, a signal indicating the overflow state is output to the N-value detection circuit; and when the N-value detection circuit receives the signal indicating the overflow state, the N-value detection circuit does not detect the delay clock cycle number, but sets the delay clock cycle number to a predetermined value.

According to the present invention, when the signal indicating an overflow state is input, the N-value detection circuit sets the number of delayed clock cycles to the predetermined value, therefore the N-value detection circuit does not perform a counting operation to obtain the number of delayed clock cycles. Accordingly, the present invention can prevent the execution time of the N-value detection sequence from exceeding a predetermined period. Therefore, even if the lock time is extended due to the overflow state of the delay line, the execution time of the N-value detection sequence can be controlled to end within a predetermined period so as to avoid malfunction.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The delay control circuit, the semiconductor memory device, and the delay control method according to the embodiments of the present invention are described in detail herein with reference to the accompanying drawings. These examples are only illustrations, however, and the present invention is not limited thereto.

In addition, descriptions such as "the first", "the second", and "the third" in this specification etc. are used to distinguish a certain constituent element from other constituent elements, and are not intended to limit number, sequence or priority etc. of the constituent elements. For example, when "first element" and "second element" are described, it does not mean that only "first element" and "second element" are used, nor does it mean that "first element" must take precedence over "second element".

Figure 1:
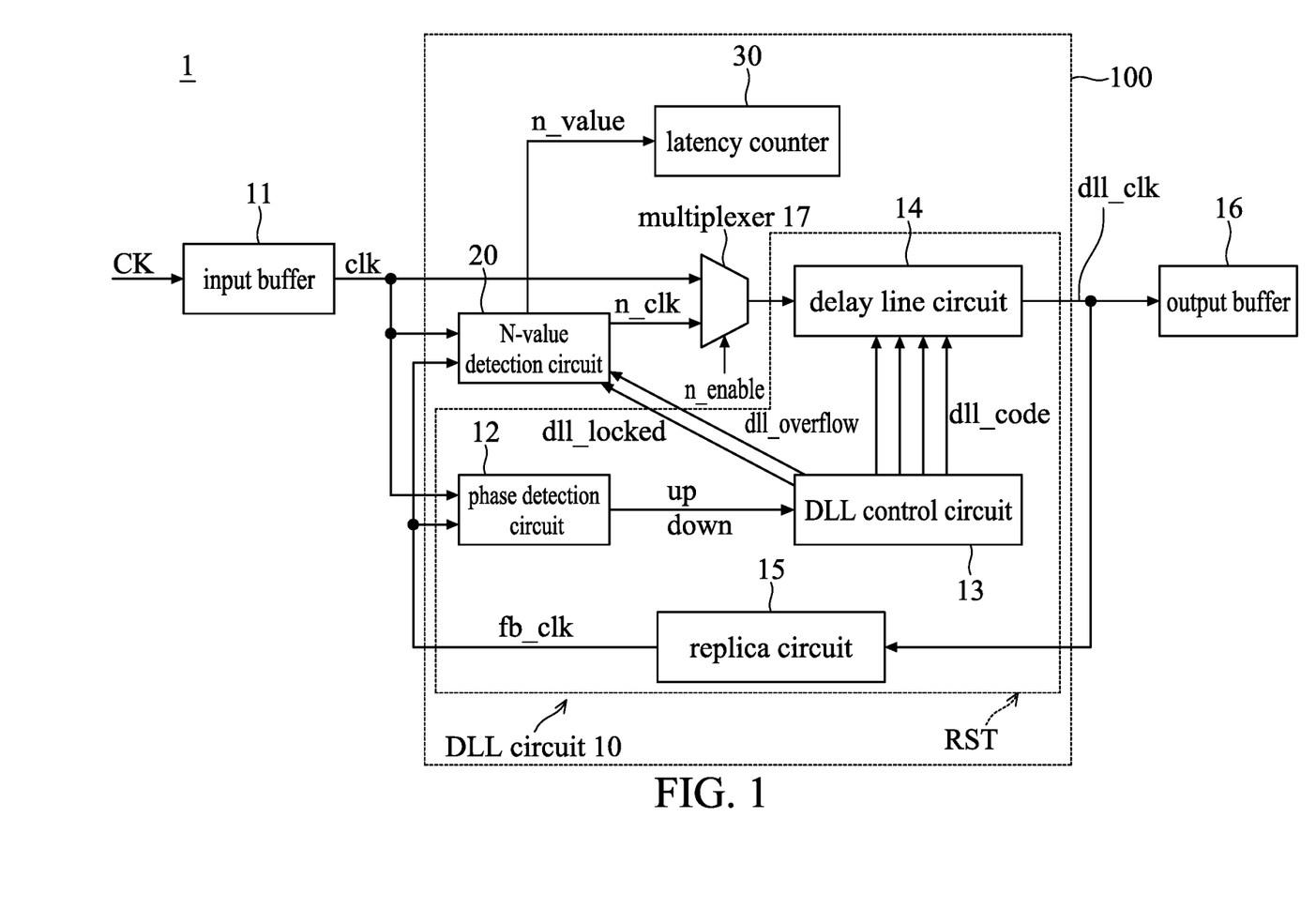
FIG. 1 is a schematic block diagram of a delay control circuit in accordance with an embodiment of the present invention.

FIG. 1 schematically shows a peripheral circuit of a semiconductor memory device 1 in accordance with an embodiment of the present invention. In this embodiment, the peripheral circuit includes an input buffer 11, a delay control circuit 100, and an output buffer 16. The delay control circuit 100 includes a DLL circuit 10, a multiplexer 17, an N-value detection circuit 20, and a latency counter 30. In this embodiment, the semiconductor memory device 1 is, for example, a DRAM, but the invention is not intended to be limited thereto. When the reset signal RST (that is, the start signal of the locking operation) is input from a predetermined circuit (not shown), the DLL circuit 10 starts the locking operation. By delaying the input clock signal clk, the output clock signal dll_clk can be synchronized with the input clock signal clk, and the locking operation (also referred to as a delay operation) is complete. When the DLL circuit 10 ends the locking operation, the N-value detection circuit 20 performs an N-value detection operation under predetermined conditions, where the N-value is equivalent to the number of delayed clock cycles, and a N-value signal n_value representing the N-value is output to the latency counter 30, which is described in detail below. In this embodiment, the operations performed from the time when the DLL circuit 10 receives the reset signal RST until the output of the N-value signal n_value are collectively referred to as "N-value detection sequence". In addition, in this embodiment, the "N-value detection operation" refers to counting the number of delayed clock cycles from the input clock signal to the output clock signal.

In addition, in this embodiment, in order to simplify the description, except for the input buffer 11 and the output buffer 16, the conventional configuration (for example: command decoder, memory cell array, and interface circuits for input and output, etc.) in the semiconductor memory device 1 is not illustrated.

The DLL circuit 10 of this embodiment includes a phase detection circuit 12, a DLL control circuit 13, a delay line circuit 14, and a replica circuit 15. In one embodiment, the replica circuit 15 is a replica of the output buffer 16 coupled to the output of the delay line circuit 14.

The input buffer 11 is configured to buffer the external clock signal CK input to the input buffer 11 to generate the input clock signal clk. The input clock signal clk generated by the input buffer 11 is sent to the N-value detection circuit 20 and the phase detection circuit 12, and is selectively sent to the delay line circuit 14 through the multiplexer 17. The delay line circuit 14 is configured to generate a delayed signal of the input clock signal clk (i.e., the output clock signal dll_clk) and transmit it to the output buffer 16 and the replica circuit 15, which are described in detail below. The replica circuit 15 outputs the output clock signal dll_clk generated by the delay line circuit 14 to the N-value detection circuit 20 and the phase detection circuit 12 as the feedback signal fb_clk.

The input clock signal clk and the feedback signal fb_clk are input to the phase detection circuit 12. The phase detection circuit 12 detects the phase difference between the input clock signal clk and the feedback signal fb_clk. The phase detection circuit 12 generates a phase signal up/down, and outputs the phase signal up/down to the DLL control circuit 13. The phase signal up/down is configured to indicate that the phase of the feedback signal fb_clk is ahead of, or behind, the phase of the input clock signal clk.

The DLL control circuit 13 determines the amount of delay according to the phase difference detected by the phase detection circuit 12. Specifically, the DLL control circuit 13 determines the amount of delay and controls the delay line circuit 14 according to the phase signal up/down from the phase detection circuit 12. The DLL control circuit 13 generates a control signal dll_code composed of a plurality of bits and outputs it to the delay line circuit 14.

The delay line circuit 14 is, for example, a variable delay circuit configured to activate the internal variable delay line according to the control signal dll_code to change the delay time. When the control signal n_enable described later is input to the multiplexer 17 at a high level (that is, when the N-value detection operation is performed), the multiplexer 17 outputs the signal n_clk as an output and provides it to the delay line circuit 14; when the control signal n_enable is input to the multiplexer 17 at a low level, the multiplexer 17 outputs the input clock signal clk to the delay line circuit 14. As the number of high-level bits in the control signal dll_code increases (that is, there are more delay lines activated), the delay line circuit 14 delays the input clock signal clk longer to output the output clock signal dll_clk (that is, the delay time from the input clock signal clk to the output clock signal dll_clk becomes longer). In this way, the delay line circuit 14 generates the output clock signal dll_clk by delaying the input clock signal clk, and outputs the output clock signal dll_clk to the output buffer 16 and the replica circuit 15 as described above.

In this embodiment, the DLL control circuit 13 is configured to generate the control signal dll_locked, and output the control signal dll_locked to the N-value detection circuit 20. The high-level control signal dll_locked is configured to indicate the end of the locking operation. Specifically, when the phase difference of the phase signal up/down converges to a predetermined range, it is considered that the locking operation has been completed, and the DLL control circuit 13 sets the control signal dll_locked to a high level for indicating that the input clock signal clk and the feedback signal fb_clk (corresponding to the delayed signal (output clock signal) dll_clk) are synchronized and then provides the control signal dll_locked to the N-value detection circuit 20. In addition, when the DLL circuit 10 is in the overflow state (for example, all the bits constituting the control signal dll_code are at high level, that is, when all the delay lines are activated), the DLL control circuit 13 sets the control signal dll_overflow to a high level for indicating that the DLL circuit 10 is in an overflow state, and outputs the control signal dll_overflow to the N-value detection circuit 20. In addition, in this embodiment, the overflow state refers to a state in which all delay lines are activated, but it is not limited thereto. In an alternative embodiment, the overflow state may also refer to a state in which more than a predetermined number of delay lines among all delay lines are activated (that is, among the plurality of bits constituting the control signal dll_code, more than a predetermined number of bits are at high level).

In addition, when it is determined that the DLL circuit 10 is in an overflow state, the DLL control circuit 13 may also set the control signal dll_locked to a high level and provide the control signal dll_locked to the N-value detection circuit 20. In this way, when entering the overflow state, even if the input clock signal clk and the output clock signal dll_clk are not synchronized, the DLL control circuit 13 can directly notify the N-value detection circuit 20 that the input clock signal clk and the delay signal (output clock signal) dll_clk have been synchronized (in other words, the locking operation has ended).

After the locking operation is complete (in other words, when the input clock signal clk and the delay signal dll_clk are synchronized, or the control signal dll_locked is at a high level), the N-value detection circuit 20 detects the N-value and outputs it to the latency counter 30. Here, the so-called N-value is the N-value represented by Tint (existing delay time in the DLL circuit 10)+Tdll (lock (delay) time caused by the locking operation of the DLL circuit 10)=NxtCK, which is configured to indicate the number of delayed clock cycles (hence an integer) from the input clock signal to the output clock signal during the locking operation of the DLL circuit 10.

When the locking operation of the DLL circuit 10 has ended, the N-value detection circuit 20 detects the N-value by counting. However, when the DLL circuit 10 is in the overflow state (that is, when the control signal dll_overflow is at a high level (also called asserted)), the N-value detection circuit 20 does not detect the N-value, but uses a predetermined set value as the N-value. In this way, when the DLL circuit 10 is in the overflow state, the N-value detection sequence can be ended early without performing the N-value detection operation. In the past, when tCK was much larger than Tint, especially when the DLL circuit 10 was in the overflow state to lengthen Tdll, the overall time of the N-value detection sequence may exceed a predetermined period tDLLK, for example, 512 clock cycles. However, in this embodiment, since the predetermined value is used directly as the N-value without counting in the overflow state, the N-value detection sequence can be ended within a predetermined period tDLLK.

Specifically, in this embodiment, when the DLL circuit 10 finishes the locking operation but is not in the overflow state, (that is, when the N-value detection circuit 20 receives the low-level control signal dll_overflow and the high-level control signal dll_locked), the N-value detection circuit 20 performs an N-value detection operation, and uses the detected N-value as an N-value signal n_value, generates an N-value signal n_value indicating the N-value, and outputs it to the latency counter 30. Then, when the DLL circuit 10 is in an overflow state (that is, when the N-value detection circuit 20 receives the high-level control signal dll_overflow), the N-value detection circuit 20 does not perform the N-value detection operation, but uses a predetermined value as the N-value signal n_value, generates the N-value signal n_value indicating the N-value, and outputs it to the latency counter 30. In this embodiment, the predetermined value is 1, but it is not intended to be limited thereto, and the predetermined value may also be set appropriately to meet requirements.

Figure 2A:
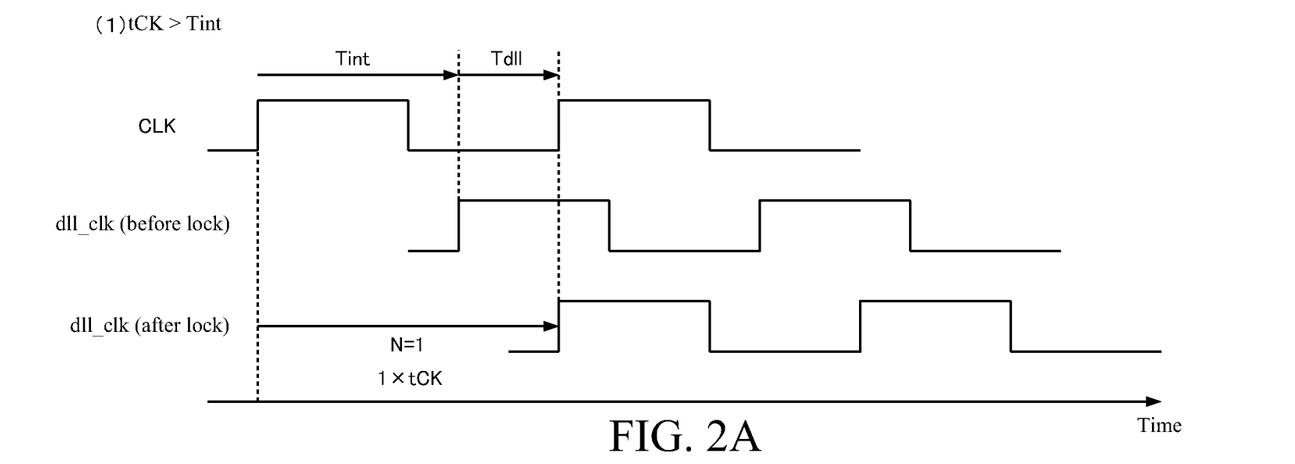
FIGS. 2A and 2B are diagrams showing the changes of signals and the lock time when tCK exceeds Tint, when the DLL circuit is in a non-overflow state or an overflow state.
Figure 2B:
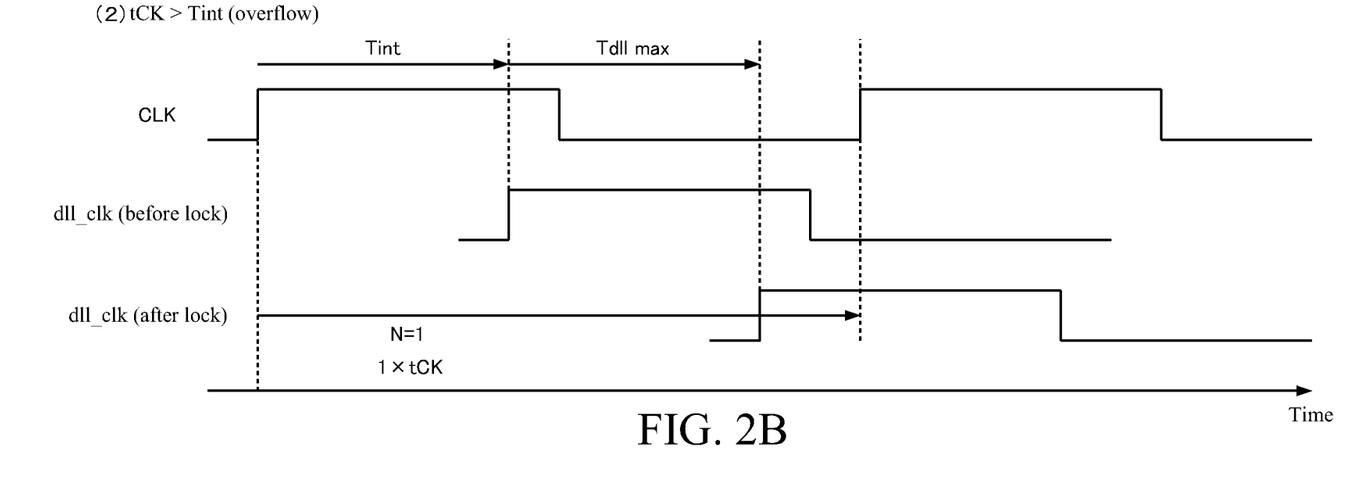

As shown in FIG. 2A, in the prior art, when tCK is greater than Tint and the DLL circuit is not in the overflow state, in response to the high-level control signal dll_locked, the N-value detected by the N-value detection circuit is 1, and the rising edge of the external clock signal CLK is synchronized with the rising edge of the output clock signal dll_clk after the locking operation is complete. As shown in FIG. 2B, when tCK is greater than Tint and the DLL circuit is in the overflow state (the lock time Tdll is the maximum value Tdll), even if the N-value is 1, the rising edge of the external clock signal CLK is not synchronized with the rising edge of the output clock signal dll_clk after the locking operation is complete (for example, after the locking operation is complete, the rising edge of the external clock signal CLK is later than the rising edge of the output clock signal dll_clk by a time tDQSCK) in the prior art.

Figure 3:
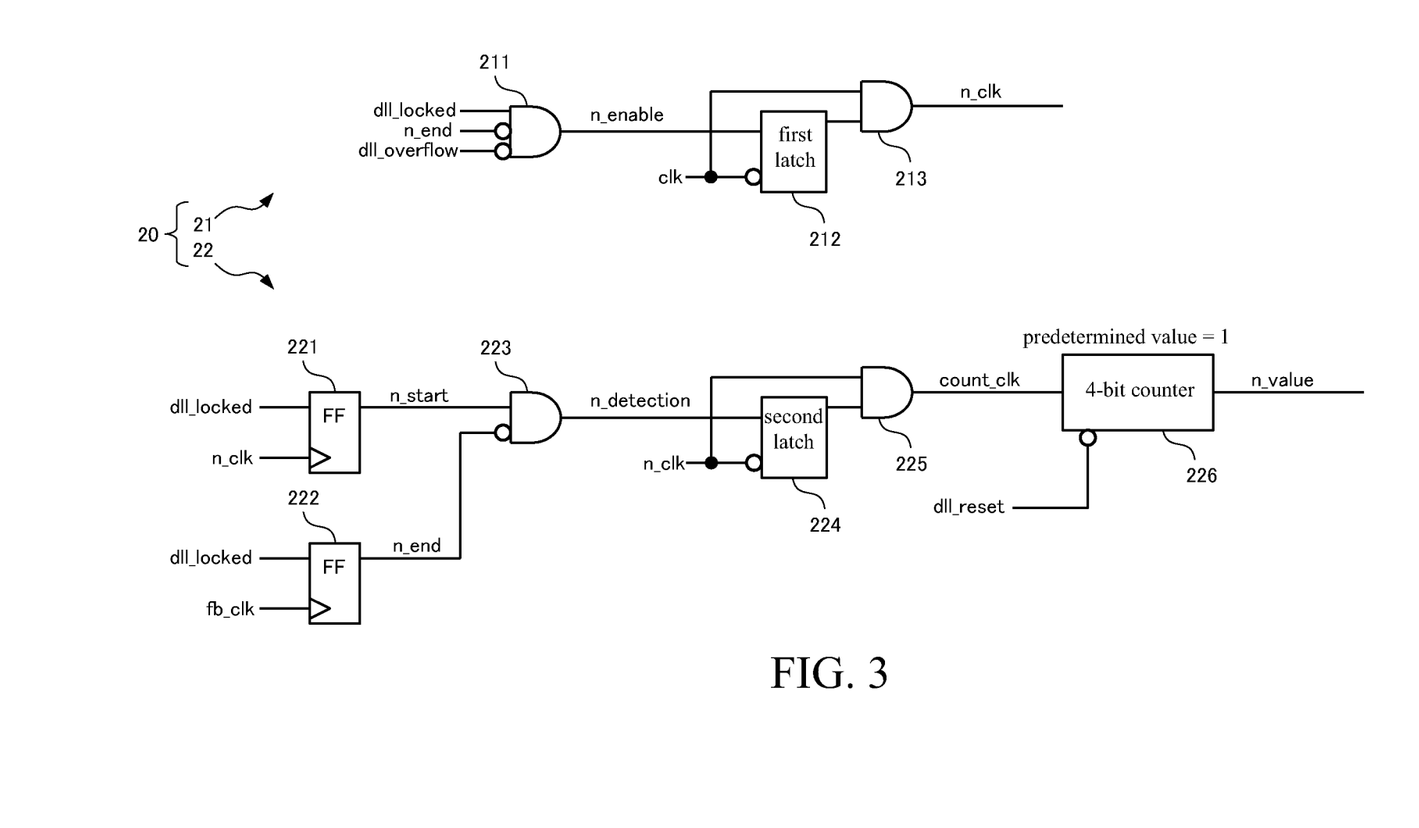
FIG. 3 is a schematic diagram of an N-value detection circuit in accordance with an embodiment of the present invention.

FIG. 3 is a schematic diagram of an N-value detection circuit 20 in accordance with an embodiment of the present invention The N-value detection circuit 20 includes an n_clk signal generating circuit 21 and an N-value counting circuit 22. The n_clk signal generating circuit 21 includes a first AND circuit 211, a first latch 212, and a second AND circuit 213. The N-value counting circuit 22 includes two D-type flip-flops (FF) 221, 222, a third AND circuit 223, a second latch 224, a fourth AND circuit 225, and a 4-bit counter 226.

During the N-value detection operation, the n_clk signal generating circuit 21 generates a signal n_clk corresponding to the input clock signal clk. The first AND circuit 211 of the n_clk signal generating circuit 21 receives the control signal dll_locked, the signal n_end described later, and the control signal dll_overflow, and generates the control signal n_enable. When the control signal n_enable is at a high level, the N-value detection operation is enabled. The first latch 212 receives the control signal n_enable and the input clock signal clk as the clock signal. In addition, the second AND circuit 213 receives the signal output from the first latch 212 and the input clock signal clk, and outputs a signal n_clk.

During the detection operation of the N-value, the N-value counting circuit 22 counts the number of clock cycles of the input clock signal clk from the input of the input clock signal clk to the input of the feedback signal fb_clk, to detect the N-value. The flip-flop 221 of the N-value counting circuit 22 receives the signal n_clk and the control signal dll_locked, and generates the signal n_start. The flip-flop 222 receives the feedback signal fb_clk corresponding to the output clock signal dll_clk and the control signal dll_locked, and generates the signal n_end. Then, the third AND circuit 223 receives the signal n_start and the signal n_end, and generates the signal n_detection. The second latch 224 receives the signal n_detection and the signal n_clk as a clock signal, and couples the output to the fourth AND circuit 225. The fourth AND circuit 225 receives the output of the second latch 224 and the signal n_clk, and outputs the signal count_clk, which is an N-value counting signal. The signal count_clk is input to the 4-bit counter 226.

The 4-bit counter 226 detects the N-value by counting the pulses of the signal count_clk, and outputs an N-value signal n_value indicating the detected N-value. When the 4-bit counter 226 receives the reset signal dll_reset for resetting the count value of the 4-bit counter 226, the count value is reset to 0.

In this way, when the control signal dll_locked is at a high level, the N-value counting circuit 22 starts counting the number of clock cycles (pulses) of the signal count_clk from the input of the signal n_clk corresponding to the input clock signal clk until the feedback signal fb_clk corresponding to the delay signal (output clock signal) dll_clk as the number of delayed clock cycles to perform the N-value detection operation.

Referring to FIG. 1, the latency counter 30 is configured to receive the N-value signal n_value indicating the N-value detected by the N-value detection circuit 20.

In addition, when the control signal dll_overflow at a high level is input to the N-value detection circuit 20, the 4-bit counter 226 of the N-value counting circuit 22 sets the N-value signal n_value to a predetermined value (1 herein), and outputs the N-value signal n_value (the predetermined value) to the latency counter 30.

The latency counter 30 is synchronized with the internal clock generated by the DLL circuit 10 to count the latency. In addition, after the predetermined period tDLLK has elapsed, the latency counter 30 performs counting of the latency by using the N-value signal n_value. For example, in the case of the column address strobe (CAS) latency, the set latency indicates the number of clock cycles from a command (for example, a read command) is input to a semiconductor memory device (a DRAM herein) until data (for example, read data) is output from the semiconductor memory device. In this case, when the reset signal RST is input to the DLL circuit 10, the latency counter 30 counts, for example, based on a value obtained by subtracting the N-value from the value of the CAS latency set in the mode register (not shown). For example, when the value of the CAS latency is 10 and the N-value is 5, the latency counter 30 subtracts the two to obtain 5 of clock cycles as the counting result of the latency.

The delay control method of this embodiment is described below with the timing diagram shown in FIG. 4. First, a delay control method when the DLL circuit 10 is not in the overflow state is described below.

At time point t1, the reset signal RST (the start signal of the locking operation) is input to the DLL circuit 10 from a predetermined circuit (not shown in FIG. 4) so that the DLL circuit 10 enters the DLL reset state. At time point t2, the DLL circuit 10 starts operating in a locking operation. In addition, when the DLL circuit 10 is in the DLL reset state, the reset signal dll_reset is input to the 4-bit counter 226 of the N-value counting circuit 22, and the N-value is set to 0 in the 4-bit counter 226.

Next, at time point t2, the locking operation of DLL starts, and the DLL circuit 10 is shifted to the DLL lock state. First, the phase detection circuit 12 performs phase detection according to the received input clock signal clk and the feedback signal fb_clk, and sends the phase signal up/down to the DLL control circuit 13. The DLL control circuit 13 determines the delay amount based on the phase signal up/down, and transmits the control signal dll_code set to a high level to the delay line circuit 14 according to the delay amount. In the delay line circuit 14, the delay line generates the output clock signal dll_clk delayed by a predetermined time from the input clock signal clk. The output clock signal dll_clk is output as a feedback signal fb_clk through the replica circuit 15 and the feedback signal fb_clk is input to the phase detection circuit 12 as feedback.

Figure 4:
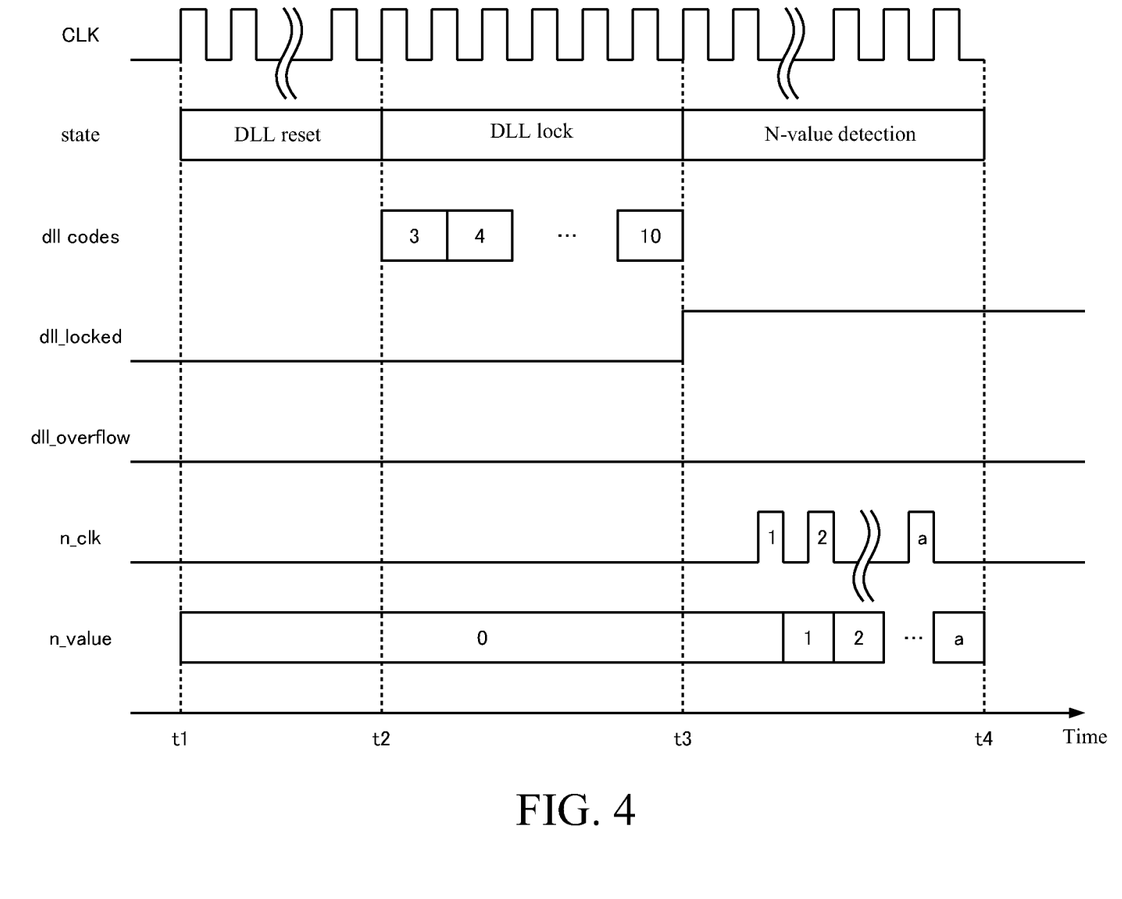
FIG. 4 is a timing diagram illustrating voltage transitions of each signal in the delay control circuit when the DLL circuit is in a non-overflow state in accordance with an embodiment of the present invention.

At time point t3, the phase difference of the phase signal up/down is converged to a predetermined range, and the delay is eliminated (in the example shown in FIG. 4, the control signal dll_code at this time is "10", that is 10 delay lines are activated at the stage). Thus, at time point t3, the DLL control circuit 13 sets the control signal dll_locked to a high level, also sets the control signal dll_overflow to a low level, and inputs the control signals dll_locked and dll_overflow to the N-value detection circuit 20. Thereby, the N-value detection state starts from time point t3.

At time t3, when the control signal dll_locked at a high level is input to the first AND circuit 211 of the n_clk signal generating circuit 21 and the signal n_end and the control signal dll_overflow at a low level are input to the first AND circuit 211, a high-level control signal n_enable is generated. The first latch 212 receives the control signal n_enable and the input clock signal clk, and the signal generated by the first latch 212 together with the input clock signal clk are input to the second AND circuit 213 to generate the signal n_clk through the second AND circuit 213.

In the N-value counting circuit 22, when the control signal dll_locked at a high level is input to the first flip-flop 221, a signal n_start at a high level is generated according to the signal n_clk. On the other hand, when the feedback signal fb_clk at a low level is input to the second flip-flop 222, a signal n_end at a low level is generated. Then, the signal n_start at a high level and the signal n_end at a low level are input to the third AND circuit 223 to generate a signal n_detection at a high level. The signal n_detection and the signal n_clk are input to the second latch 224. The fourth AND circuit 225 receives the output of the second latch 224 and the signal n_clk to generate and output the signal count_clk, which is a signal for counting the N-value. The signal count_clk is input to the 4-bit counter 226.

In the 4-bit counter 226, at the beginning of the N-value detection state, the N-value is set to 0. Each time a pulse of the signal count_clk corresponding to the signal n_clk is received, the 4-bit counter 226 increments the value of the N-value signal n_value by 1 and outputs it. Thereby, the value of the N-value signal n_value is counted up according to the signal n_clk, and the N-value signal n_value is output to the latency counter 30. In the N-value counting circuit 22, the value of the N-value signal n_value is counted up according to the signal n_clk from time point t3 to time point t4. In addition, in the example shown in FIG. 4, the case where the N-value is counted up to the value "a" (a is an integer equal to or greater than 3 herein) is taken as an example.

At time point t4, in the N-value counting circuit 22, when the feedback signal fb_clk at a high level is input to the second flip-flop 222, a signal n_end at a high level is generated. In addition, in response to the signal n_end shifting to a high level, the n_clk signal generating circuit 21 generates a control signal n_enable at a low level and a signal n_clk at a low level, and ends the N-value detection operation. In addition, in the N-value counting circuit 22, in response to the signal n_end shifting to a high level, the signal n_detection and the signal count_clk shift to a low level. On the other hand, in response to the control signal n_enable at a low level, the multiplexer 17 selects the input clock signal clk as an output, so that the delay line circuit 14 outputs the output clock signal dll_clk which is synchronized with the input clock signal clk.

In this way, the N-value detection circuit 20 outputs the detected value "a" to the latency counter 30 as the N-value.

In addition, the 4-bit counter 226 can also output the N-value signal n_value to the latency counter 30 constantly between the time points t3~t4; the N-value signal n_value can also be output to the latency counter 30 at time point t4 that the N-value detection state has ended. After the predetermined period tDLLK, since the latency counter 30 uses the N-value signal n_value to perform the latency counting, as long as the correct N-value is input from the N-value detection circuit 20 during the period before the predetermined period tDLLK, the latency can be properly counted.

Figure 5:
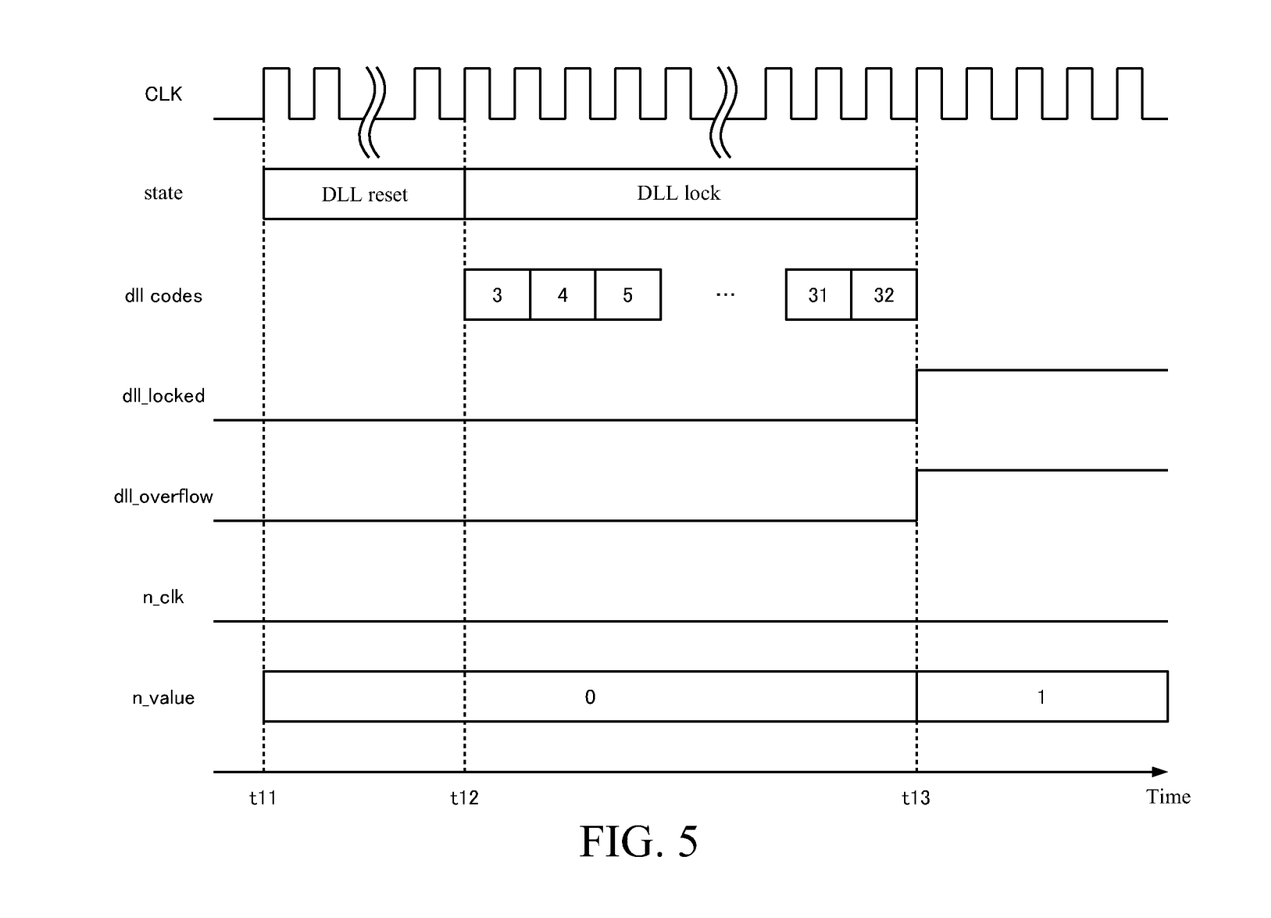
FIG. 5 is a timing diagram illustrating voltage transitions of each signal in the delay control circuit in an overflow state in accordance with an embodiment of the present invention.

Next, the delay control method of the present invention in the overflow state is described below and illustrated in FIG. 5.

At time point t11, when the reset signal RST is input to the DLL circuit 10 from a predetermined circuit (not shown in FIG. 5) and the DLL circuit 10 enters the DLL reset state, the reset signal dll_reset is input to 4-bit counter 226 to set the N-value to 0.

After becoming the DLL reset state, the DLL circuit 10 as described above performs the locking operation at time point t12. However, when the phase difference cannot be resolved by the predetermined delay amount, for example all the delay lines are activated (in the example shown in FIG. 5, all 32 delay lines are activated), at time point t13, the DLL control circuit 13 provides the control signal dll_overflow at a high level to the N-value detection circuit 20. In addition, the DLL control circuit 13 can also provide the control signal dll_locked at a high level to the N-value detection circuit 20.

At time point t13, the n_clk signal generating circuit 21 generates a control signal n_enable at a low level. In addition, when the control signal n_enable is at a low level, a signal n_clk at a low level is generated.

In response to the signal n_clk at a low level, the N-value counting signal count_clk at a low level generated in the N-value detection circuit 20 is input to the 4-bit counter 226. In addition, at time point t13, when the N-value detection circuit 20 receives the high-level control signal dll_overflow, the 4-bit counter 226 outputs the predetermined set value (1 herein) as the N-value signal n_value to the latency counter 30.

Thus, when the DLL circuit 10 overflows, the N-value detection circuit 20 does not perform the N-value detection operation, but uses a predetermined value (1 herein) as the N-value, and outputs it to the latency counter 30.

Figure 6A:
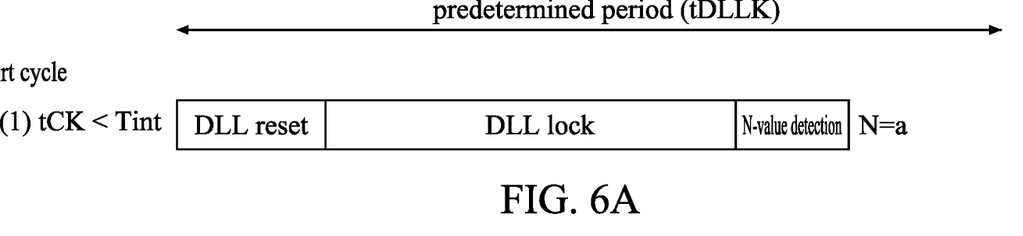
FIGS. 6A, 6B, and 6C are diagrams comparing the execution time and the predetermined period of the N-value detection sequence in the overflow state of the embodiment of the present invention with those of the prior art.
Figure 6B:
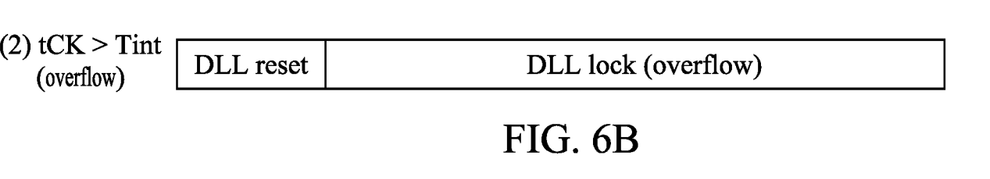
Figure 6C:
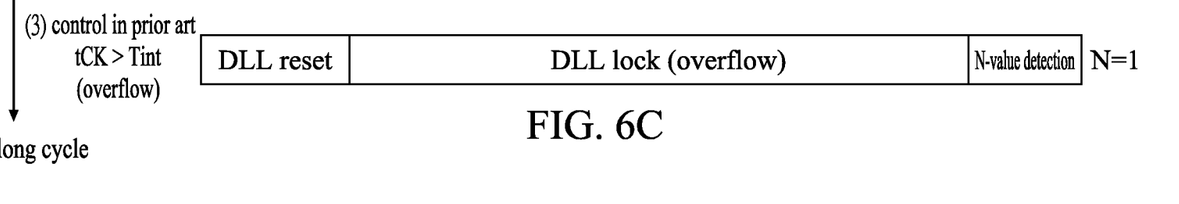

In this way, when the DLL circuit 10 is not in the overflow state (i.e., tCK<Tint) after the locking operation has ended, the N-value detection circuit 20 performs the N-value detection operation, and outputs the detected N-value to latency counter 30. Therefore, as shown in FIG. 6A, the N-value detection sequence ends after the reset state, the lock state and the N-value detection state. Here, when tCK<Tint, it is generally considered that the detected N-value is an integer of 2 or more. FIG. 6A shows an example in which the detected N-value is the above-mentioned value "a". According to an embodiment of the present invention, when the DLL circuit 10 is in an overflow state at the end of the locking operation, the N-value detection circuit 20 does not count clock cycles for detecting the N-value. Therefore, when an overflow occurs as shown in FIG. 6B, since the N-value detection state can be omitted, compared to the situation of the prior art shown in FIG. 6C, the time spent in the N-valued detection sequence can also be shortened even if the time for the lock state is longer than that for the non-overflow state. In this way, the execution time of the N-value detection sequence can be made shorter than the predetermined period tDLLK, and the DLL circuit 10 can immediately return to the next DLL control after the N-value detection sequence.

Therefore, the present disclosure provides a green technology by reducing operation time and power consumption of the DRAM. Besides, even in the case of environmental changes, the delay control circuit of the present invention can still operate normally and has high stability, so as to be suitable for being applied in field of electric vehicles.

In addition, in this embodiment, the semiconductor memory device including the control circuit is DRAM as an example for illustration. However, the present invention is not intended to be limited thereto. For example, the semiconductor memory device may also be Static Random Access Memory (SRAM), flash memory, or other semiconductor memory devices.

The structure of the DLL circuit 10 in the above-mentioned embodiment is only an example, and can be changed appropriately, or other various structures can be adopted. In addition, although FIG. 3 shows the structure of the N-value detection circuit 20, this structure is only an example, and it can be changed accordingly, or other various structures can be adopted.

Besides, the semiconductor memory devices of the present disclosure may be used on automotive electronics, such as Advanced Driver Assistance Systems (ADAS), Instrument Clusters, Infotainment. The semiconductor memory devices of the present disclosure may be used on Industrial applications, such as aerospace, medical, safety equipment, health & fitness, industrial controls, instrumentation, security, transportation, telecommunications, PoS machines, human machine interface, programmable logic controller, smart meter, and industrial networking. The semiconductor memory devices of the present disclosure may be used on communication and networking devices such as STB, switches, routers, passive optical networks, xDSL, wireless access point, cable modem, power line communications M2M, mobile phones, base stations, DECT phones, and many other new communication products. The semiconductor memory devices of the present disclosure may be used on desktops, notebooks, servers, gaming notebooks, ultrabooks, tablets, convertibles, HDD, and SSD. The semiconductor memory devices of the present disclosure may be used on space constrained applications including Wearable, MP3 players, smart watches, games, digital radio, toys, cameras, digital photo album, GPS, Bluetooth and WiFi modules. The semiconductor memory devices of the present disclosure may be used on television, display and home electronics.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure.

What is claimed is:

1. A delay control circuit, comprising:
   a DLL control circuit, configured to determine a delay amount based on a phase difference between an input clock signal and an output clock signal;
   a delay line circuit, configured to delay the input clock signal to generate the output clock signal based on the delay amount; and
   a N-value detection circuit, configured to perform an N-value detection operation when the input clock signal and the output clock signal are synchronized, wherein the N-value detection operation is configured to detect a number of delayed clock cycles from the input clock signal to the output clock signal;
   wherein the DLL control circuit is configured to determine whether the delay control circuit is in an overflow state by determining whether the delay amount exceeds a predetermined delay amount of the delay line circuit, wherein when it is determined that the delay control circuit is in the overflow state, a signal indicating the overflow state is output to the N-value detection circuit;
   wherein when the N-value detection circuit receives the signal indicating the overflow state, the N-value detection circuit does not perform the N-value detection operation, but instead sets the number of delayed clock cycles to a predetermined value.

2. The delay control circuit as defined in claim 1, wherein when it is determined that the delay control circuit is not in the overflow state and the input clock signal and the output clock signal are synchronized, the N-value detection circuit performs the N-value detection operation by counting the number of delayed clock cycles from the input clock signal to the output clock signal.

3. The delay control circuit as defined in claim 2, further comprising:
   a replica circuit, configured to use the output clock signal generated by the delay line circuit as a feedback signal and output the feedback signal;
   wherein the N-value detection circuit detects the number of delayed clock cycles based on the input clock signal and the feedback signal that is output by the replica circuit.

4. The delay control circuit as defined in claim 2, further comprising:
   a replica circuit, configured to use the output clock signal generated by the delay line circuit as a feedback signal and output the feedback signal; and
   a phase detection circuit, configured to receive the input clock signal and the feedback signal to detect the phase difference;
   wherein the DLL control circuit determines the delay amount based on the phase difference generated by the phase detection circuit.

5. The delay control circuit as defined in claim 1, wherein when the signal indicating the overflow state at a high level is output to the N-value detection circuit, the N-value detection circuit sets the number of delayed clock cycles to the predetermined value.

6. The delay control circuit as defined in claim 1, wherein when the input clock signal and the output clock signal are synchronized, the DLL control circuit outputs a signal indicating that the input clock signal and the output clock signal are synchronized to the N-value detection circuit;
   wherein when the N-value detection circuit receives a signal indicating that the input clock signal and the output clock signal are synchronized, the N-value detection circuit performs the N-value detection operation.

7. The delay control circuit as defined in claim 3, wherein when it is determined that the delay control circuit is in the overflow state, the DLL control circuit outputs a signal indicating that the locking operation has ended to the N-value detection circuit.

8. The delay control circuit as defined in claim 3, wherein the predetermined value is 1.

9. The delay control circuit as defined in claim 7, wherein the N-value detection circuit comprises:
   an N-value counting circuit, configured to generate an end signal based on the signal indicating that the locking operation has ended and the feedback signal; and
   a signal generating circuit, configured to generate an enable control signal based on the signal indicating that the locking operation has ended, the signal indicating the overflow state, and the end signal.

10. The delay control circuit as defined in claim 1, wherein the overflow state is a state in which all the delay lines in the delay line circuit are activated.

11. The delay control circuit as defined in claim 9, wherein the signal generating circuit of the N-value detection circuit is configured to generate a clock control signal based on the enable control signal and the input clock signal, and the N-value counting circuit generates a start signal based on the clock control signal and the signal indicating that the locking operation has ended.

12. The delay control circuit as defined in claim 11, wherein the N-value counting circuit of the N-value detection circuit comprises:
   a first AND circuit, receiving the start signal and the end signal to generate a detection signal;
   a latch, receiving the detection signal and the clock control signal;
   a second AND circuit, coupled to the output of the latch and the clock control signal to generate a signal for counting an N-value; and
   a 4-bit counter, configured to receive the signal for counting the N-value and a reset signal and output a signal indicating the detected N-value.

13. The delay control circuit as defined in claim 11, further comprising:
   a multiplexer, receiving the input clock signal and the clock control signal generated by the N-value detection circuit, selecting the input clock signal or the clock control signal as an output based on the enable control signal generated by the signal generating circuit, and providing the output to the delay line circuit; and
   a latency counter, coupled to the N-value detection circuit to receive the delayed clock cycles.

14. A semiconductor memory device, comprising:
   a delay control circuit as defined in claim 1;
   a memory cell array;
   an input buffer, configured to provide the input clock signal; and
   an output buffer, coupled to the output of the delay line circuit.

15. The semiconductor memory device as defined in claim 14,
Wherein the semiconductor memory device is a dynamic random access memory.

16. A delay control method, comprising:
determining a delay amount based on a phase difference between an input clock signal and an output clock signal;
delaying the input clock signal based on the delay amount to generate the output clock signal;
when the input clock signal and the output clock signal are synchronized, detecting a number of delayed clock cycles from the input clock signal to the output clock signal by using an N-value detection circuit;
determining whether it is in an overflow state by determining whether the delay amount exceeds a predetermined delay amount in the delay line circuit, and when it is in the overflow state, a signal indicating the overflow state is output to the N-value detection circuit; and
when the N-value detection circuit receives the signal indicating the overflow state, the N-value detection circuit does not detect the number of delayed clock cycles but the N-value detection circuit sets the number of delayed clock cycles to a predetermined value.

17. The delay control method as defined in claim 16,
wherein when it is not in the overflow state, and when the input clock signal and the output clock signal are synchronized, the N-value detection circuit performs the N-value detection operation by counting the number of delayed clock cycles from the input clock signal to the output clock signal.

18. The delay control method as defined in claim 16,
wherein when it is in the overflow state, the DLL control circuit outputs a signal indicating that a locking operation has ended to the N-value detection circuit.

19. The delay control method as defined in claim 18, further comprising:
outputting the output clock signal generated by the delay line circuit as a feedback signal;
generating an end signal based on the signal indicating that the locking operation has ended and the feedback signal; and
generating the enable control signal based on the signal indicating that the locking operation has ended, the signal indicating the overflow state, and the end signal by the signal generating circuit.

20. The delay control method as defined in claim 19, wherein the overflow state is a state in which all the delay lines in the delay line circuit are activated.

* * * * *